(12) United States Patent
Hasegawa et al.

(10) Patent No.: US 7,573,970 B2
(45) Date of Patent: Aug. 11, 2009

(54) PRESCALER AND BUFFER

(75) Inventors: Katashi Hasegawa, Kasugai (JP); Koju Aoki, Kasugai (JP); Hiroshi Baba, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/510,720

(22) Filed: Aug. 28, 2006

(65) Prior Publication Data

US 2007/0223648 A1 Sep. 27, 2007

(30) Foreign Application Priority Data

Mar. 27, 2006 (JP) .............................. 2006-086074

(51) Int. Cl.
*H03K 9/06* (2006.01)
(52) U.S. Cl. ..................... 377/47; 377/48; 327/276; 327/115; 327/117
(58) Field of Classification Search .................. None
See application file for complete search history.

(56) References Cited

U.S. PATENT DOCUMENTS

| | | | |
|---|---|---|---|
| 3,641,370 A * | 2/1972 | Heimbigner | 327/172 |
| 5,212,411 A | 5/1993 | Asazawa | |
| 5,970,110 A | 10/1999 | Li | |
| 6,031,425 A | 2/2000 | Hasegawa | |
| 6,163,194 A * | 12/2000 | Truong et al. | 327/259 |
| 6,255,879 B1 * | 7/2001 | Voss | 327/276 |
| 6,466,065 B1 | 10/2002 | Takekawa | |
| 7,064,621 B2 | 6/2006 | Nakanishi | |
| 2003/0006365 A1 | 1/2003 | Yamaguchi et al. | |
| 2005/0046483 A1 | 3/2005 | Kim et al. | |
| 2005/0046497 A1 | 3/2005 | Nakanishi | |

FOREIGN PATENT DOCUMENTS

| | | |
|---|---|---|
| EP | 0 810 598 A | 12/1997 |
| EP | 1 755 215 A | 2/2007 |
| JP | 6-197011 A | 7/1994 |
| JP | 9-261012 A | 10/1997 |
| JP | 11-46136 A | 2/1999 |
| JP | 2001-136059 A | 5/2001 |

OTHER PUBLICATIONS

1019990079792 KR.

* cited by examiner

*Primary Examiner*—Tuan Lam
(74) *Attorney, Agent, or Firm*—Arent Fox LLP

(57) ABSTRACT

A prescaler that operates in a broad band. The prescaler includes a buffer and a counter. The buffer includes a first amplification circuit, which has three inverter circuits of different drive capacities, a second amplification circuit, which has four series-connected inverter circuits, and a feedback circuit. One of the inverter circuits is connected between a capacitor and an inverter circuit via a first switch circuit and a second switch circuit. This varies the drive capacity of the first amplification circuit. The feedback circuit functions as a variable resistor having two transistors.

12 Claims, 5 Drawing Sheets

PRESCALER AND BUFFER

CROSS-REFERENCE TO RELATED APPLICATIONS

This application is based upon and claims the benefit of priority from the prior Japanese Patent Application No. 2006-086074, filed on Mar. 27, 2006, the entire contents of which are incorporated herein by reference.

BACKGROUND OF THE INVENTION

The present invention relates to a prescaler and, more particularly, to a buffer for a prescaler.

In recent years, communication terminal devices, such as cellular phones, have become widely used, and various communication formats exist in the field of wireless communication. Each communication format uses a different frequency band. Thus, a base station is required to have a PLL frequency synthesizer that operates in a broad band and is capable of receiving radio waves in a broad frequency band. Accordingly, it is also required that the PLL frequency synthesizer use a prescaler and a buffer circuit that is operable in a broad band.

In the prior art, a PLL frequency synthesizer is used to stably obtain frequencies corresponding to many channels. The PLL frequency synthesizer locks a phase by using the output of a crystal oscillator and obtains the desired frequency by adjusting a frequency dividing ratio. In such a PLL frequency synthesizer, a prescaler for reducing the frequency is used.

Figure 1:
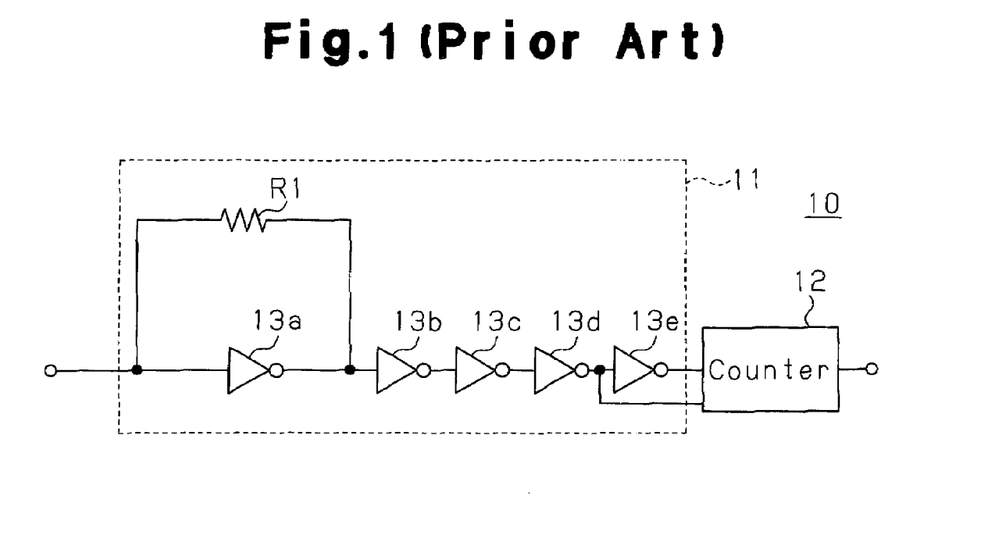
FIG. 1 is a schematic circuit diagram of a prior art prescaler.

FIG. 1 is a schematic circuit diagram showing a prescaler 10 in the prior art.

The prescaler 10 includes a buffer 11 and a counter 12. The buffer 11 includes a plurality of series-connected inverter circuits 13a, 13b, 13c, 13d, and 13e. The first inverter circuit 13a has an input terminal connected to a capacitor (not shown). Thus, a feedback resistor R1, which applies self-bias on the inverter circuit 13a, is connected between the input and output terminals of the inverter circuit 13a.

Japanese Laid-Open Patent Publication No. 6-197011 describes a prescaler that operates in a broad band. Further, Japanese Laid-Open Patent Publication No. 9-261012 describes a buffer circuit for a voltage controlled oscillator having a linear voltage-frequency characteristic.

SUMMARY OF THE INVENTION

Figure 2:
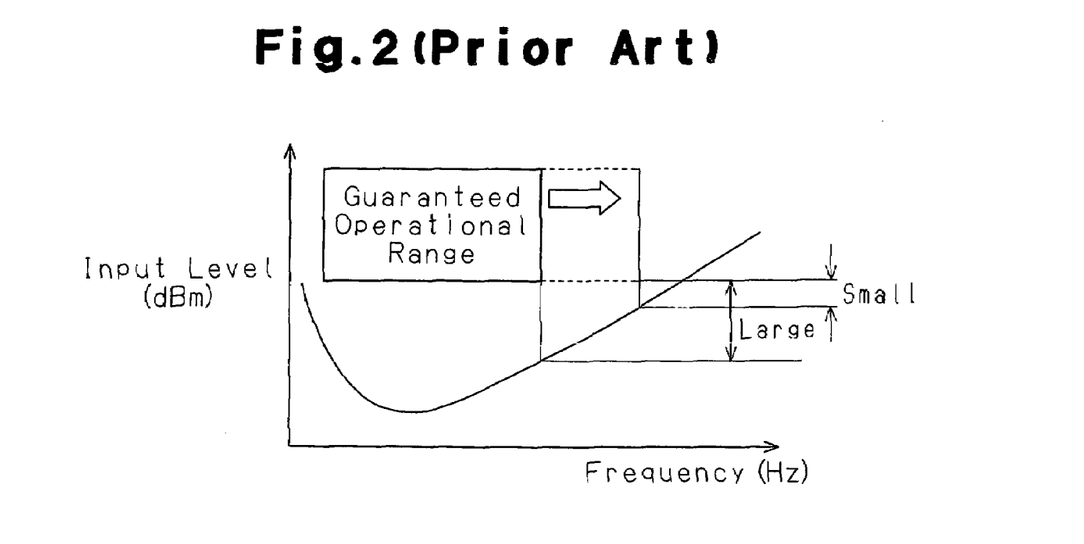
FIG. 2 is a graph showing the relationship between the input level and frequency of the prescaler shown in FIG. 1.

In the prescaler 10, the edge of an input signal provided to the buffer 11 is rounded by a time constant, which is determined by the capacitor and resistor R1 connected to the inverter circuit 13a. This restricts the frequency band for the input signal level of the prescaler 10. The capacitor, which is externally connected to an LSI including the prescaler 10, has a fixed capacitance. Thus, the frequency characteristic of a PLL frequency synthesizer including a prescaler 10 is determined by the resistance of the resistor R1 and the current drive capacity of the first inverter circuit 13a. FIG. 2 shows an example of the guaranteed operational range for a PLL frequency synthesizer. For a high frequency band, the guaranteed operational range of the PLL frequency synthesizer is enlarged in the direction of the arrow by a range indicated by broken lines in FIG. 2. This lowers the input sensitivity (margin for guaranteed operational range) of the prescaler 10 in a high frequency band. Thus, in a high frequency band, the operation of the PLL frequency synthesizer cannot be guaranteed.

Figure 3A:
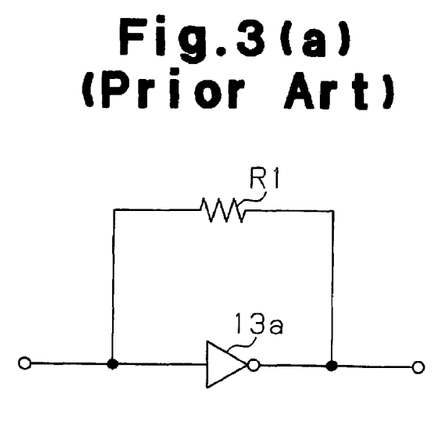
FIG. 3(a) is a schematic circuit diagram of a negative feedback circuit formed by the first inverter circuit and resistor of the buffer shown in FIG. 1.
Figure 3B:
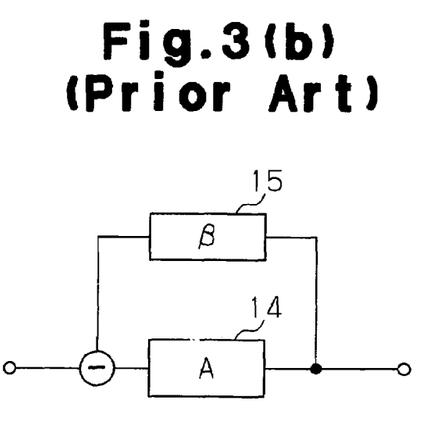
FIG. 3(b) is a schematic equivalent circuit diagram of the negative feedback circuit shown in FIG. 3(a)
Figure 4:
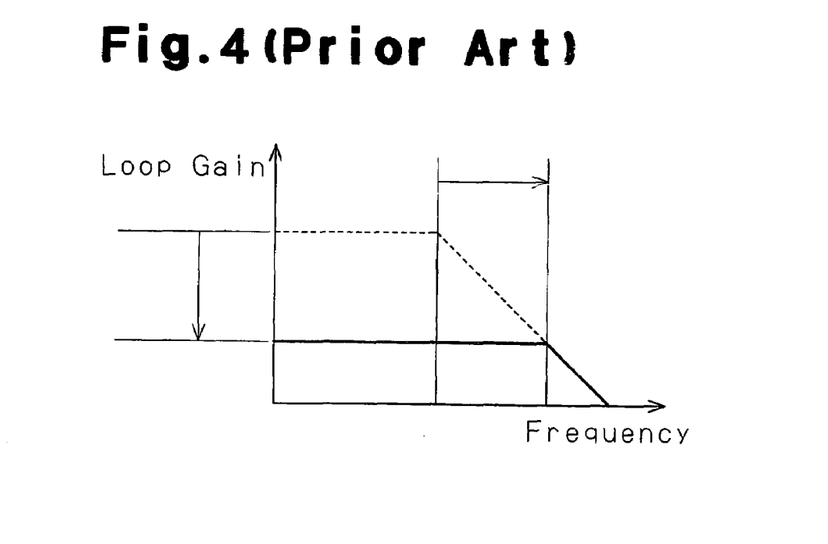
FIG. 4 is a characteristic diagram showing the relationship between the frequency and gain of the prescaler shown in FIG. 1.

FIG. 3(a) is a schematic circuit diagram of a negative feedback circuit formed by the inverter circuit 13a and the resistor R1 of the buffer 11 shown in FIG. 1. FIG. 3(b) is a schematic equivalent circuit diagram of the negative feedback circuit shown in FIG. 3(a). As shown in FIG. 3(b), the inverter circuit 13a is represented by an amplification circuit 14 having a gain A, and the resistor R1 is represented by a feedback circuit 15 having feedback rate β. In the prescaler 10 of the prior art, the feedback rate β of the feedback circuit 15 is increased (resistance of the resistor R1 is decreased) for a high frequency band. This lowers the gain of the prescaler 10 as shown by the solid line in FIG. 4. As a result, the prescaler cannot be operated in a broad band.

The present invention provides a prescaler and a buffer that operate in a broad band.

One aspect of the present invention is a prescaler for frequency-dividing an input signal and generating a divisional signal. The prescaler includes a buffer for amplifying the input signal and generating an output signal. A frequency divider divides the output signal of the buffer by a predetermined frequency dividing ratio and generates the divisional signal. The buffer includes a first amplification circuit for receiving the input signal and generating the output signal from the input signal. The first amplification circuit has a variable drive capacity. A feedback circuit, connected to the first amplification circuit, feeds back the output signal of the first amplification circuit to the first amplification circuit. The feedback circuit has a variable resistance.

A further aspect of the present invention is a prescaler for frequency-dividing an input signal and generating a divisional signal. The prescaler includes a buffer for amplifying the input signal and generating an output signal. A frequency divider divides the output signal of the buffer by a predetermined frequency dividing ratio and generates the divisional signal. The buffer includes a first amplification circuit for receiving the input signal and generating the output signal from the input signal. The first amplification circuit has a variable drive capacity. A feedback circuit, connected to the first amplification circuit, feeds back the output signal of the first amplification circuit to the first amplification circuit.

Another aspect of the present invention is a buffer for amplifying an input signal and generating an output signal. The buffer includes a first amplification circuit for receiving the input signal and generating the output signal from the input signal. The first amplification circuit has a variable drive capacity. A feedback circuit, connected to the first amplification circuit, feeds back the output signal of the first amplification circuit to the first amplification circuit. The feedback circuit has a variable resistance.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

A frequency synthesizer 21 according to a preferred embodiment of the present invention will now be described with reference to FIGS. 5 to 8.

Figure 5:
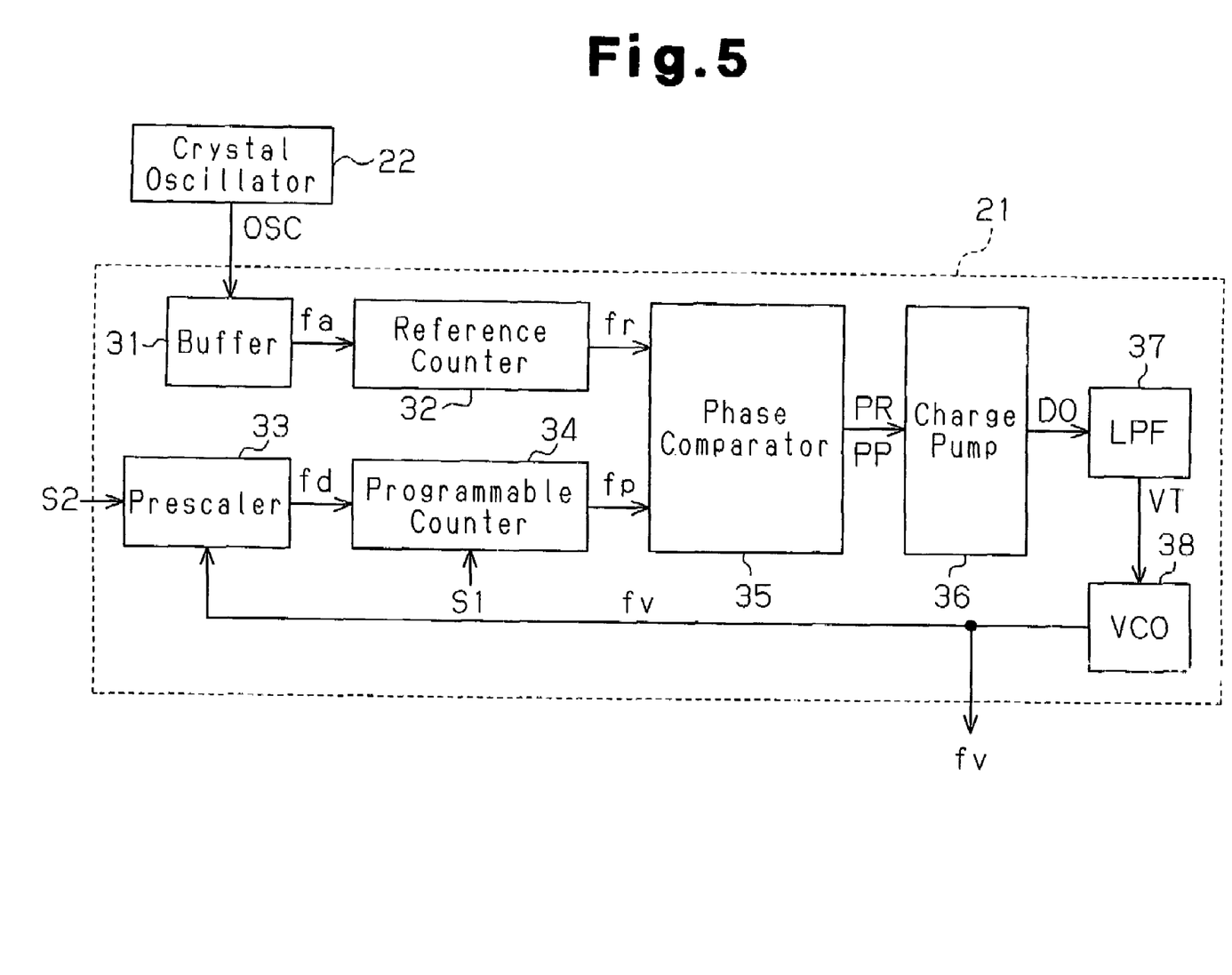
FIG. 5 is a schematic block circuit diagram of a PLL frequency synthesizer according to a preferred embodiment of the present invention.

Referring to FIG. 5, the frequency synthesizer 21 is connected to a crystal oscillator 22. The crystal oscillator 22 oscillates a crystal oscillation element to generate an oscillation signal OSC having a fixed frequency. The frequency synthesizer 21 generates a signal having a stable frequency based on the oscillation signal OSC of the crystal oscillator 22.

The frequency synthesizer 21 includes a buffer 31, a reference counter (first counter) 32 functioning as a reference frequency divider, a prescaler 33, a programmable counter (second counter) 34 functioning as a comparison frequency divider, a phase comparator 35, a charge pump 36, a low pass filter (LPF) 37, and a voltage controlled oscillator (VCO) 38.

The buffer 31 is provided with the oscillation signal OSC. The buffer 31 amplifies the oscillation signal OSC and generates a reference signal fa, which is provided to the first counter 32. The first counter 32 divides the reference signal fa by a predetermined frequency dividing ratio to generate a reference divisional signal fr, which is provided to the phase comparator 35.

The phase comparator 35 is also provided with a comparison divisional signal fp from the second counter 34. The phase comparator 35 compares the phases of the two signals fr and fp and provides the charge pump 36 with an up pulse signal PR and a down pulse signal PP having pulse widths in accordance with the phase difference of the signals fr and fp.

The charge pump 36 provides the LPF 37 with a signal DO having a current value that is based on the up pulse signal PR and the down pulse signal PP.

The LPF 37 eliminates high frequency components from the output signal DO of the charge pump 36 by smoothing the output signal DO. The LPF 37 generates a control signal VT having a DC voltage and provides the control signal VT to the VCO 38. The VCO 38 provides the prescaler 33 and an external circuit (not shown) with an output signal fv having a frequency that is in accordance with the voltage value of the control signal VT.

The prescaler 33 receives the output signal fv as an input signal, divides the output signal fv by a fixed frequency dividing ratio (1/P) to generate a comparison signal fd (divisional signal), and provides the second counter 34 with the comparison signal fd. The second counter 34 divides the comparison signal fd by a frequency dividing ratio (1/N) to generate a comparison divisional signal fp and provides the phase comparator 35 with the comparison divisional signal fp. The frequency dividing ratio of the second counter 34 is set based on the input signal S1.

In the frequency synthesizer 21, when the frequency of the output signal fv becomes less than a predetermined frequency (lock frequency), the frequency of the comparison divisional signal fp becomes less than the frequency of the reference divisional signal fr. This produces a difference between the phases of the two signals fr and fp. The phase comparator 35 generates the up pulse signal PR and the down pulse signal PP having pulse widths that are in accordance with the phase difference between the two signals fr and fp. For example, the phase comparator 35 generates an up pulse signal PR having a pulse width that is greater than the pulse width of the down pulse signal PP.

The charge pump 36 provides the LPF 37 with the output signal DO, which is in accordance with the pulse width of each of the up pulse signal PR and the down pulse signal PP. The LPF 37 varies the voltage value of the control signal VT based on the output signal DO. For example, the LPF 37 increases the voltage value of the control signal VT. The VCO 38 generates the output signal fv having a high frequency in response to the control signal VT, which has a high voltage value.

Conversely, when the frequency of the output signal fv becomes greater than a predetermined frequency, the frequency of the comparison divisional signal fp becomes greater than the frequency of the reference divisional signal fr. This produces a difference between the phases of the two signals fr and fp. The phase comparator 35 generates an up pulse signal PR and a down pulse signal PP having pulse widths that are in accordance with the phase difference between the two signals fr and fp.

The charge pump 36 provides the LPF 37 with the output signal DO, which is in accordance with the pulse width of each of the up pulse signal PR and the down pulse signal PP. The LPF 37 lowers the voltage value of the control signal VT based on the output signal DO. The VCO 38 generates the output signal fv having a low frequency in response to the control signal VT, which has a low voltage value.

The frequency synthesizer 21 repeats the above operations and locks the output signal fv generated by the VCO 38 at a predetermined frequency. The frequency synthesizer 21 changes the frequency dividing ratio of the second counter 34 with the signal S1 to vary the lock frequency of the output signal fv.

Figure 6:
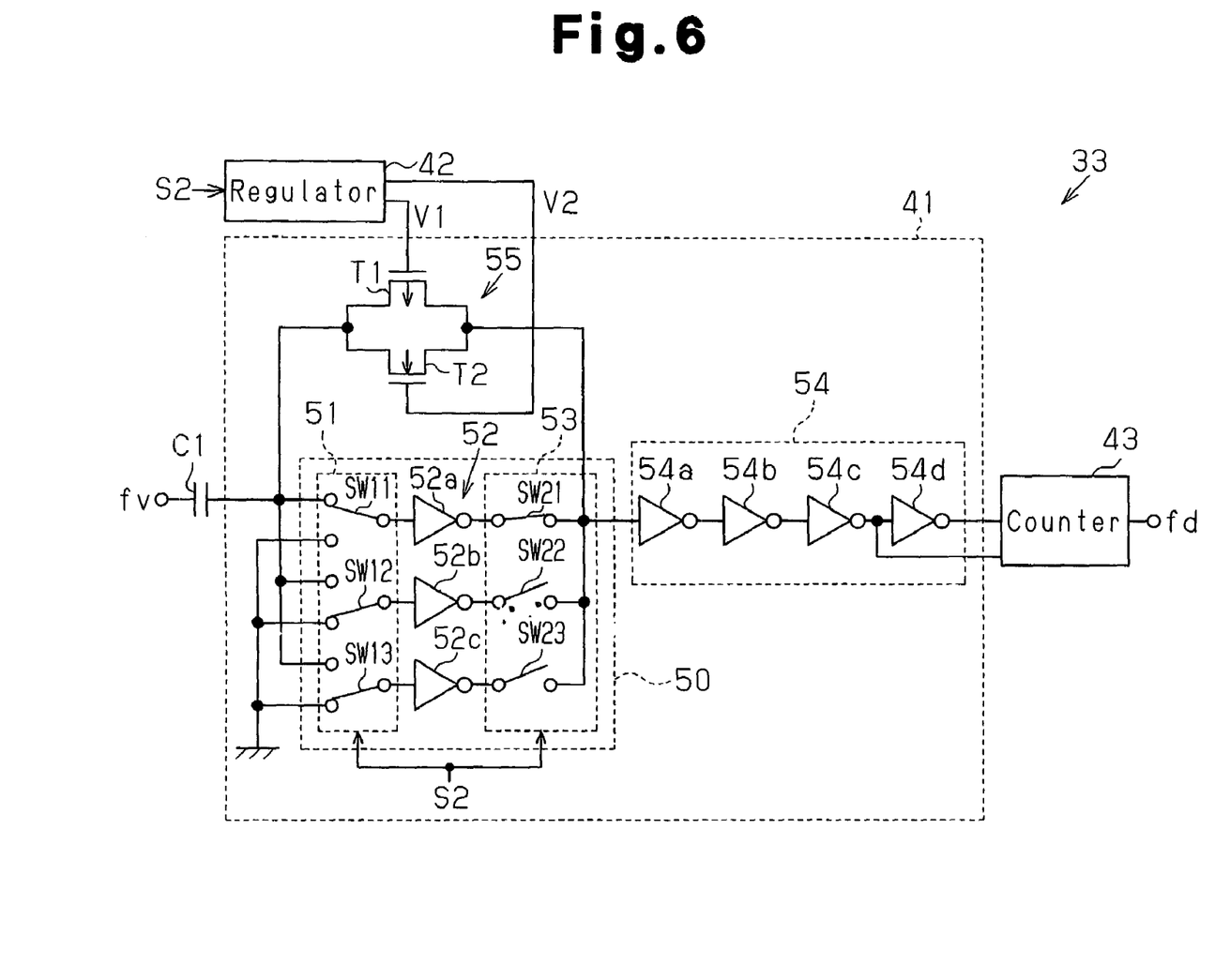
FIG. 6 is a schematic circuit diagram of the prescaler shown in FIG. 5.
Figure 7:
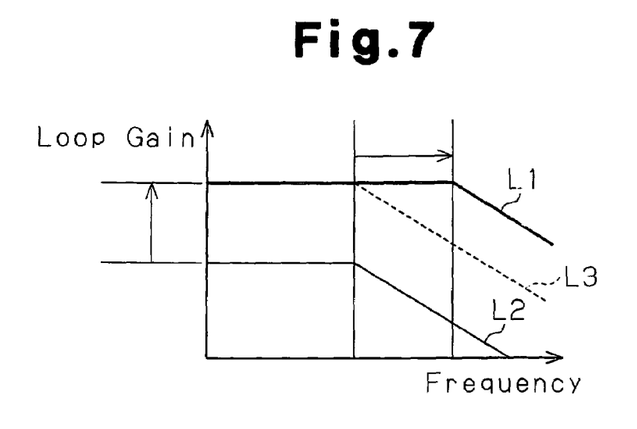
FIG. 7 is a characteristic diagram showing the relationship between the frequency and gain of the prescaler shown in FIG. 5.

FIG. 6 is a schematic circuit diagram of the prescaler 33 shown in FIG. 5. The prescaler 33 includes a buffer 41, a regulator 42 functioning as a voltage generation circuit, and a counter 43 functioning as a frequency divider.

The buffer 41 is connected to a first terminal of a capacitor C1. The capacitor C1 has a second terminal provided with the output signal fv. That is, the buffer 41 is connected via the capacitor C1 to the VCO 38 and the external circuit.

The buffer 41 includes a first switch circuit 51, an amplification circuit 52, a second switch circuit 53, an amplification circuit 54, and a feedback circuit 55. The amplification circuit 54 includes four series-connected inverter circuits 54a, 54b, 54c, and 54d. In the preferred embodiment, the first switch circuit 51 and the second switch circuit 53 form a selection circuit, and the amplification circuit 52 and the selection circuit (first and second switch circuits 51 and 53) form a first amplification circuit 50. The amplification circuit 54 functions as a second amplification circuit.

The amplification circuit 52 includes three inverter circuits 52a, 52b, and 52c having different drive capacities. The drive capacity of each of the inverter circuits 52a, 52b, and 52c is set by changing the size of the transistor forming the inverter circuit. For example, in the preferred embodiment, the first, second, and third inverter circuits 52a, 52b, and 52c respectively have first, second, and third drive capacities. The first drive capacity is greater than the second drive capacity, and the second drive capacity is greater than the third drive capacity. Thus, among the three inverter circuits 52a, 52b, and 52c, the first drive capacity of the first inverter circuit 52a is the highest, and the third drive capacity of the third inverter circuit 52c is the lowest.

The first switch circuit 51 is connected between the amplification circuit 52 and the first terminal of the capacitor C1. The second switch circuit 53 is connected between the amplification circuit 52 and the inverter circuit 54a of the amplification circuit 54. The first switch circuit 51 receives a control signal S2 and connects an input terminal of one of the inverter circuits 52a, 52b, and 52c forming the amplification circuit 52 to the capacitor C1 in response to the control signal S2. The second switch circuit 53 receives the control signal S2 and connects the output terminal of the inverter circuit that is connected to the capacitor C1 via the first switch circuit 51 to the inverter circuit 54a of the second amplification circuit 54 in response to the control signal S2.

More specifically, the first switch circuit 51 includes switches SW11, SW12, and SW13, the quantity (three) of which is the same as the quantity of the inverter circuits in the amplification circuit 52. The switches SW11, SW12, and SW13 each include two switch terminals and one common terminal. The common terminals of the switches SW11, SW12, and SW13 are respectively connected to the input terminals of the inverter circuits 52a, 52b, and 52c. In each of the switches SW11, SW12, and SW13, the first switch terminal is connected to the first terminal of the capacitor C1 and the second switch terminal is connected to ground. The control signal S2 represents information that independently controls the switches SW11, SW12, and SW13 of the first switch circuit 51 and is, for example, a three-bit signal. Accordingly, for example, when connecting the input terminal of the inverter circuit 52a to the capacitor C1, the first switch circuit 51 connects the input terminals of the other inverter circuits 52b and 52c to ground.

The second switch circuit 53 includes switches SW21, SW22, and SW23, the quantity (three) of which is the same as the quantity of the inverter circuits in the amplification circuit 52. The switches SW21, SW22, and SW23 each include a first terminal connected to the output terminal of the corresponding one of the inverter circuits 52a, 52b, and 52c and a second terminal connected to the input terminal of the inverter circuit 54a. The control signal S2 represents information that independently controls the switches SW21, SW22, and SW23 of the second switch circuit 53 and is, for example, a three-bit signal.

For example, when the control signal S2 is "001B", the first switch circuit 51 connects the input terminal of the inverter circuit 52a to the capacitor C1 and the input terminals of the inverter circuits 52a and 52c to the ground. Further, the second switch circuit 53 activates the switch SW21 to connect the output terminal of the inverter circuit 52a to the input terminal of the inverter circuit 54a and inactivate the switches SW22 and SW23. When the control signal S2 is "010B", the first switch circuit 51 connects the input terminal of the inverter circuit 52b to the capacitor C1 and the input terminals of the inverter circuits 52a and 52c to the ground. Further, the second switch circuit 53 activates the switch SW22 to connect the output terminal of the inverter circuit 52b to the input terminal of the inverter circuit 54a and inactivate the switches SW21 and SW23. When the control signal S2 is "100B", the first switch circuit 51 connects the input terminal of the inverter circuit 52c to the capacitor C1 and the input terminals of the inverter circuits 52a and 52c to the ground. Further, the second switch circuit 53 activates the switch SW23 to connect the output terminal of the inverter circuit 52c to the input terminal of the inverter circuit 54a and inactivate the switches SW21 and SW22.

In the above configuration, one of the three inverter circuits 52a, 52b, and 52c is selected by the control signal S2. The input terminal of the selected inverter circuit is connected to the capacitor C1, and the output terminal of the selected inverter circuit is connected to the input terminal of the inverter circuit 54a. Accordingly, the control signal S2 varies the drive capacity of the amplification circuit 52 (i.e., first amplification circuit 50) by three levels.

The feedback circuit 55 is connected to a node between the first switch circuit 51 and the capacitor C1 and a node between the second switch circuit 53 and the input terminal of the inverter circuit 54a. The feedback circuit 55 includes a pair of parallel-connected transistors T1 and T2. The first transistor T1 is formed by a P-channel MOS transistor, and the second transistor T2 is formed by an N-channel MOS transistor.

The gates of the transistors T1 and T2 are each connected to the regulator 42. The regulator 42 is provided with the control signal S2. The regulator 42 generates gate voltages V1 and V2 in accordance with the control signal S2 and supplies the gate voltages V1 and V2 to the transistors T1 and T2, respectively. The transistors T1 and T2 have predetermined ON resistances corresponding to the gate voltages V1 and V2, respectively. The ON resistances are varied by the gate voltages V1 and V2. Thus, the feedback circuit 55 functions as a variable resistor.

When the inverter circuit 52a having the first drive capacity is selected, the regulator 42 generates the gate voltages V1 and V2 so that the transistors T1 and T2 respectively have relatively small first ON resistances R1a and R2a. When the inverter circuit 52b having the second drive capacity is selected, the regulator 42 generates the gate voltages V1 and V2 so that the transistors T1 and T2 respectively have second ON resistances R1b and R2b, which are greater than the first ON resistances R1a and R2a. When the inverter circuit 52c having the third drive capacity is selected, the regulator 42 generates the gate voltages V1 and V2 so that the transistors T1 and T2 respectively have third ON resistances R1c and R2c, which are greater than the second ON resistances R1b and R2b.

The input signal and output signal of the final inverter circuit 54d in the second amplification circuit 54 is provided to the counter 43. The counter 43 divides the output signal of the buffer 41 by a fixed frequency dividing ratio (1/P) to generate the comparison signal fd. For example, the counter 43 counts the pulses in the output signal of the inverter circuit 54d to generate the comparison signal fd at a high level when the count value reaches a fixed value (P). Further, the counter 43 generates the comparison signal fd at a low level in response to the input signal of the inverter circuit 54d. This generates the comparison signal fd with a pulse signal having a pulse width that is the same as the output signal of the inverter circuit 54d.

In the above frequency synthesizer 21, the buffer 41 of the prescaler 33 simultaneously switches the drive capacity of the amplification circuit 52 and the resistance of the feedback circuit 55 based on the control signal S2.

Figure 8:
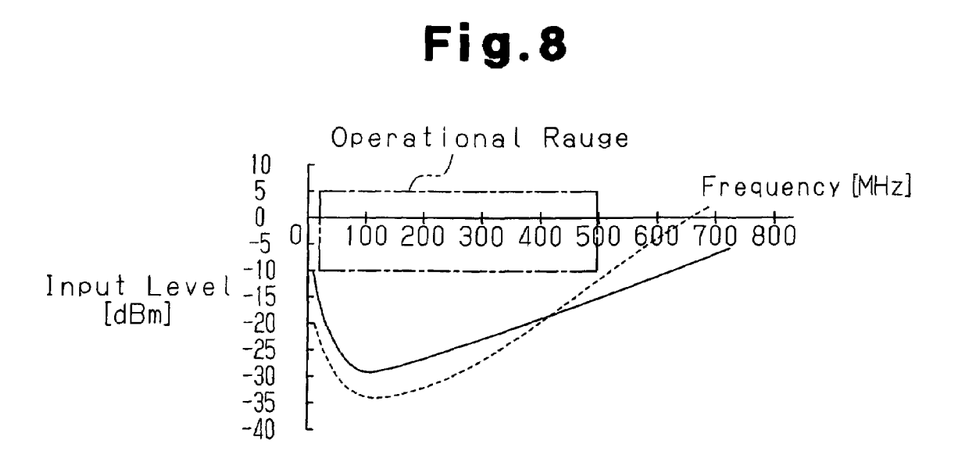
FIG. 8 is a graph showing the relationship between the input level and frequency of the prescaler shown in FIG. 5.

In one example, with the control signal S2, the buffer 41 combines the inverter circuit 52a having the first drive capacity with the feedback circuit 55 having the relatively small resistance (first ON resistances R1a and R2a) to form an initial stage amplification circuit. In this case, the drive capacity of the inverter circuit 52a increases the loop gain of the initial stage amplification circuit and broadens the frequency band with the resistance of the feedback circuit 55. Accordingly, as shown by the solid line L1 in FIG. 7, the prescaler 33 (more specifically, the buffer 41) has a high gain, which is substantially maintained to be constant between a low frequency band and a high frequency band. Thus, as shown by the solid line in FIG. 8, the prescaler 33 has a frequency characteristic in which the input level decreases in a high frequency band (i.e., the input sensitivity is improved). The curve shown by the broken line in FIG. 8 represents the frequency characteristic of the prescaler 33 when the resistance of the feedback circuit 55 is high. In this manner, the frequency band of the prescaler 33 is enlarged to a high frequency band so as to guarantee operation of the prescaler 33 in an operational range shown by the dashed line in FIG. 8. That is, the operation of the PLL frequency synthesizer is guaranteed even in a high frequency band.

In another example, with the control signal S2, the buffer 41 combines the inverter circuit 52c having the third drive capacity with the feedback circuit 55 having the relatively large resistance (third ON resistances R1c and R2c) to form a first state amplification circuit. In this case, the characteristic of the prescaler 33 (more specifically, the buffer 41) is as shown by the sold line L2 in FIG. 7. That is, when there is no need to be applicable to a high frequency band, the drive capacity of the amplification circuit 52 is lowered to reduce the consumption current of the amplification circuit 52. This reduces the consumption current of the prescaler 33.

The frequency synthesizer 21 of the preferred embodiment has the advantages described below.

(1) The prescaler 33 includes the buffer 41 and the counter 43. The buffer 41 includes the amplification circuit 52, which includes the three inverter circuits 52a, 52b, and 52c of different drive capacities, the four series-connected inverter circuits 54a, 54b, 54c, and 54d, and the feedback circuit 55. One of the inverter circuits 52a, 52b, and 52c is connected between the capacitor C1 and the inverter circuit 54a via the first switch circuit 51 and the second switch circuit 53. The feedback circuit 55 functions as a variable resistor formed by the two transistors T1 and T2, and the resistance of the variable resistor is varied by the gate voltages V1 and V2.

Accordingly, the gain of the buffer 41 in the prescaler 33 is controlled by varying the drive capacity of the amplification circuit and the resistance of the feedback circuit 55. As a result, when the amplification circuit 52 having a relatively high drive capacity (first drive capacity) and the feedback circuit 55 having a relatively small resistance (first ON resistances R1a and R2a) are combined, the prescaler 33 has a substantially constant input sensitivity characteristic in a high frequency band. Further, when the amplification circuit 52 having a relatively low drive capacity (third drive capacity) and the feedback circuit 55 having a relatively small resistance (first ON resistances R1a and R2a) are combined, the prescaler 33 has a substantially constant input sensitivity characteristic in a low frequency band. Thus, the PLL frequency synthesizer 21 has a broad band operational characteristic.

(2) In response to the control signal S2, the first switch circuit 51 provides the input terminal of one of the inverter circuits 52a, 52b, and 52c with the signal fv. Further, in response to the control signal S2, the second switch circuit 53 connects the output terminal of one of the inverter circuits 52a, 52b, and 52c to the inverter circuit 54a. Therefore, the drive capacity of the amplification circuit 52 is easily varied.

(3) The first switch circuit 51 connects the input terminals of two of the inverter circuits 52a, 52b, and 52c that have not been selected to the ground. Thus, the input terminal level of the inverter circuits that have not been selected is stabilized. This prevents erroneous operation of the inverter circuits that have not been selected, or erroneous operation of the first amplification circuit 50.

(4) The feedback circuit 55 is formed by the transistors T1 and T2. Thus, the resistance of the feedback circuit 55 is easily varied by controlling the gate voltages V1 and V2 of the transistors T1 and T2.

(5) The regulator 42 generates the voltages V1 and V2 supplied to the gates of the transistors T1 and T2 in response to the control signal S2. Accordingly, the resistance of the feedback circuit 55 is easily varied in accordance with the control signal S2.

It should be apparent to those skilled in the art that the present invention may be embodied in many other specific forms without departing from the spirit or scope of the invention. Particularly, it should be understood that the present invention may be embodied in the following forms.

The second amplification circuit 54 is not limited to the four inverter circuits 54a, 54b, 54c, and 54d. Preferably, the second amplification circuit 54 includes two or more inverter circuits.

The second amplification circuit 54 may be disconnected from the buffer 41 and arranged in the counter 43.

The feedback circuit 55 may be formed by a single MOS transistor. In this case, the regulator 42 generates one type of gate voltage for controlling the ON resistance of the MOS transistor.

The buffer 31 shown in FIG. 5 may have the same configuration as the buffer 41 shown in FIG. 6. As a result, in the same manner as the prescaler 33, the buffer 31 also functions in a broad band.

The prescaler 33 may vary the drive capacity of the amplification circuit 52 and the resistance of the feedback circuit 55 at different timings. That is, the first switch circuit 51 and the second switch circuit 53 may be controlled by separate control signals.

The control signal S2 is not limited to three bits. Preferably, the control signal S2 is information of two or more bits for connecting the common terminal of one of the switches SW11, SW12, and SW13 to the capacitor C1 and the common terminals of the other switches SW11, SW12, and SW13 to the ground. Further, the first switch circuit 51 may decode the control signal S2 to control the switches SW11, SW12, and SW13.

The prescaler 33 may be configured to change only the drive capacity of the amplification circuit 52. In other words, the resistance of the feedback circuit 55 may be fixed. In this case, the prescaler characteristic is as shown by broken line L3 in FIG. 7. That is, increase in the drive capacity of the amplification circuit 52 enables operation of the prescaler 33 in a high frequency band. Conversely, decrease in the drive capacity of the amplification circuit 52 lowers the consumption current of the prescaler 33.

The present examples and embodiments are to be considered as illustrative and not restrictive, and the invention is not to be limited to the details given herein, but may be modified within the scope and equivalence of the appended claims.

What is claimed is:

1. A prescaler comprising:
a buffer including a first amplification circuit which amplifies an input signal and generates an output signal, with the first amplification circuit having a variable drive capacity, and a feedback circuit which feeds back the output signal of the first amplification circuit to the first amplification circuit, with the feedback circuit having a variable resistance; and a frequency divider which divides the output signal by a predetermined frequency dividing ratio to generate a divisional signal;

the first amplification circuit including:
  a plurality of inverter circuits each having an input terminal and an output terminal, with the inverter circuits having different drive capacities; and
  a selection circuit coupled to the inverter circuits and the feedback circuit;
  wherein the selection circuit includes:
    a first switch circuit, coupled to the input terminal of each of the inverter circuits, for selecting one of the inverter circuits in response to a control signal, with the inverter circuits including one or more inverter circuits coupled to ground via the first switch circuit and the inverter circuit selected by the first switch circuit; and
    a second switch circuit, coupled to the output terminal of each of the inverter circuits, for coupling the inverter circuit selected by the first switch circuit to the feedback circuit in response to the control signal and discoupling the one or more inverter circuits from the feedback circuit.

2. The prescaler according to claim 1, wherein the buffer sets the feedback circuit to have a constant resistance and varies the drive capacity of the first amplification circuit.

3. The prescaler according to claim 1, wherein the buffer further includes a second amplification circuit coupled between the first amplification circuit and the frequency divider, with the second amplification circuit receiving the output signal of the first amplification circuit and providing the output signal to the frequency divider.

4. The prescaler according to claim 3, wherein the second amplification circuit includes a plurality of series-coupled inverter circuits.

5. The prescaler according to claim 1, wherein:
the first amplification circuit includes an input terminal for receiving the input signal and an output terminal for outputting the output signal; and
the feedback circuit includes at least one MOS transistor coupled between the output terminal and input terminal of the first amplification circuit.

6. The prescaler according to claim 1, wherein:
the feedback circuit includes:
a first transistor having a first gate; and
a second transistor coupled in parallel to the first transistor and having a second gate;
the prescaler further comprising:
a voltage generation circuit for generating a first gate voltage supplied to the first gate and a second gate voltage supplied to the second gate.

7. The prescaler according to claim 6, wherein:
the first amplification circuit varies the drive capacity in response to the control signal; and
the voltage generation circuit generates the first gate voltage and the second gate voltage to vary a resistance of the feedback circuit in response to the control signal.

8. A prescaler for frequency-dividing an input signal and generating a divisional signal, the prescaler comprising:
a buffer for amplifying the input signal and generating an output signal; and a frequency divider for dividing the output signal of the buffer by a predetermined frequency dividing ratio and generating the divisional signal;

the buffer including:
a first amplification circuit for receiving the input signal and generating the output signal from the input signal, with the first amplification circuit having a variable drive capacity; and
a feedback circuit, coupled to the first amplification circuit, for feeding back the output signal of the first amplification circuit to the first amplification circuit,
  wherein the first amplification circuit includes a plurality of inverter circuits having different drive capacities, with the inverter circuits each having an input terminal and an output terminal, and a selection circuit coupled to inverter circuits and the feedback circuit, the selection circuit including:
    a first switch circuit, coupled to the input terminal of each of the inverter circuits, for selecting one of the inverter circuits in response to a control signal, with the inverter circuits including one or more inverter circuits coupled to ground via the first switch circuit and the inverter circuit selected by the first switch circuit; and
    a second switch circuit, coupled to the output terminal of each of the inverter circuits, for coupling the inverter circuit selected by the first switch circuit to the feedback circuit in response to the control signal and discoupling the one or more inverter circuits from the feedback circuit.

9. A buffer comprising:
a first amplification circuit which amplifies an input signal and generates an output signal, with the first amplification circuit having a variable drive capacity; and
a feedback circuit which feeds back the output signal of the first amplification circuit to the first amplification circuit, with the feedback circuit having a variable resistance;
the first amplification circuit including:
  a plurality of inverter circuits each having an input terminal and an output terminal, with the inverter circuits having different drive capacities; and
  a selection circuit coupled to the inverter circuits and the feedback
  wherein the selection circuit includes:
    a first switch circuit, coupled to the input terminal of each of the inverter circuits, for selecting one of the inverter circuits in response to a control signal, with the inverter circuits including one or more inverter circuits coupled to ground via the first switch circuit and the selected inverter circuit; and
    a second switch circuit, coupled to the output terminal of each of the inverter circuits, for coupling the selected inverter circuit to the feedback circuit in response to the control signal and discoupling the one or more inverter circuits from the feedback circuit.

10. The buffer according to claim 9, further comprising:
a second amplification circuit, coupled to the first amplification circuit and the feedback circuit, for amplifying the output signal of the first amplification circuit.

11. The buffer according to claim 9, wherein:
the first amplification circuit includes an input terminal for receiving the input signal and an output terminal for outputting the output signal; and the feedback circuit includes at least one MOS transistor coupled between the output terminal and input terminal of the first amplification circuit.

12. The buffer according to claim 9, wherein the feedback circuit includes:
 a first transistor having a first gate; and
 a second transistor coupled in parallel to the first transistor and having a second gate, the first and second transistors being controlled by separate gate voltages respectively supplied to the first and second gates.

* * * * *